(12) United States Patent
Davies et al.

(10) Patent No.: US 10,134,651 B2
(45) Date of Patent: Nov. 20, 2018

(54) TAMPER RESISTANT ELECTRONIC HARDWARE ASSEMBLY WITH A NON-FUNCTIONAL DIE USED AS A PROTECTIVE LAYER

(71) Applicant: QINETIQ LIMITED, Farnborough, Hampshire (GB)

(72) Inventors: Nigel Clement Davies, Malvern (GB); David John Lees, Malvern (GB)

(73) Assignee: QINETIQ LIMITED, Hampshire (GB)

( * ) Notice: Subject to any disclaimer, the term of this patent is extended or adjusted under 35 U.S.C. 154(b) by 0 days.

(21) Appl. No.: 14/899,406

(22) PCT Filed: Jun. 27, 2014

(86) PCT No.: PCT/EP2014/063745
§ 371 (c)(1),
(2) Date: Dec. 17, 2015

(87) PCT Pub. No.: WO2015/000813
PCT Pub. Date: Jan. 8, 2015

(65) Prior Publication Data
US 2016/0155679 A1  Jun. 2, 2016

(30) Foreign Application Priority Data
Jul. 2, 2013  (GB) .................................. 1311834.4

(51) Int. Cl.
| | | |
|---|---|---|
| *H01L 21/52* | (2006.01) | |
| *H01L 23/055* | (2006.01) | |
| *H01L 23/00* | (2006.01) | |
| *H01L 25/065* | (2006.01) | |

(52) U.S. Cl.
CPC ............ *H01L 23/055* (2013.01); *H01L 23/57* (2013.01); *H01L 23/576* (2013.01);
(Continued)

(58) Field of Classification Search
CPC ....... H01L 21/52; H01L 25/043; H01L 25/04; H01L 25/0657; H01L 25/0756;
(Continued)

(56) References Cited

U.S. PATENT DOCUMENTS

| | | |
|---|---|---|
| 6,853,093 B2 | 2/2005 | Cohen et al. |
| 7,288,786 B2 | 10/2007 | Janke |

(Continued)

FOREIGN PATENT DOCUMENTS

| | | |
|---|---|---|
| EP | 1508917 A2 | 2/2005 |
| FR | 2910708 A1 | 6/2008 |

(Continued)

OTHER PUBLICATIONS

Oct. 7, 2014 Written Opinion issued in International Patent Application No. PCT/EP2014/063745.
(Continued)

*Primary Examiner* — Andrew Q Tran
(74) *Attorney, Agent, or Firm* — Oliff PLC (57) ABSTRACT

An electronic hardware assembly including at least a first and second laminar component, wherein the first laminar components includes a die, the die including a substrate, a functional region and a first protective layer, and the second laminar component includes a second protective layer, wherein the first and second laminar components are arranged in a stack such that the functional region of the first laminar component is arranged within the assembly substantially between first and second protective layers.

10 Claims, 6 Drawing Sheets

(52) U.S. Cl.
CPC .............. *H01L 25/0657* (2013.01); *H01L 2224/48091* (2013.01); *H01L 2224/48227* (2013.01); *H01L 2225/0651* (2013.01); *H01L 2225/06513* (2013.01); *H01L 2225/06517* (2013.01); *H01L 2225/06527* (2013.01); *H01L 2225/06541* (2013.01); *H01L 2225/06548* (2013.01); *H01L 2225/06558* (2013.01); *H01L 2225/06568* (2013.01); *H01L 2225/06582* (2013.01); *H01L 2924/181* (2013.01)

(58) Field of Classification Search
CPC ... H01L 25/117; H01L 23/573; H01L 23/576; H01L 23/57; H01L 2224/32225; H01L 2224/73265
See application file for complete search history.

(56) References Cited

U.S. PATENT DOCUMENTS

| | | |
|---|---|---|
| 7,898,090 B1 | 3/2011 | Eaton |
| 7,966,666 B2 * | 6/2011 | Walker .................. G06F 21/87 726/34 |
| 8,296,845 B2 * | 10/2012 | Derouet .................. G06F 21/87 713/500 |
| 2006/0231633 A1 | 10/2006 | Farooq et al. |
| 2007/0121575 A1 | 5/2007 | Savry et al. |
| 2008/0251906 A1 | 10/2008 | Eaton et al. |
| 2009/0001821 A1 | 1/2009 | Walker et al. |
| 2012/0068326 A1 | 3/2012 | Das et al. |
| 2013/0037942 A1 | 2/2013 | Hwang et al. |

FOREIGN PATENT DOCUMENTS

| | | |
|---|---|---|
| RU | 2263372 C2 | 10/2005 |
| WO | 97/22990 A1 | 6/1997 |

OTHER PUBLICATIONS

Dec. 10, 2013 Search Report issued in British Patent Application No. 1311834.4.

Oct. 7, 2014 Search Report issued in International Patent Application No. PCT/EP2014/063745.

Dec. 5, 2017 Office Action issued in Japanese Patent Application No. 2016-522544.

* cited by examiner

TAMPER RESISTANT ELECTRONIC HARDWARE ASSEMBLY WITH A NON-FUNCTIONAL DIE USED AS A PROTECTIVE LAYER

FIELD OF THE INVENTION

The present invention relates to electronic hardware assemblies, and to associated methods. In particular, but not exclusively, the invention relates to providing protective layers within electronic hardware assemblies.

BACKGROUND TO THE INVENTION

In some circumstances, it is desirable to provide physical security for electronic hardware. For example, it may be desirable to protect data stored in a memory or processing device. Such data may include cryptographic keys or any other sensitive information. It is therefore known to package such hardware in a coating, which in some cases is arranged such that, if the enclosing material is tampered with, data is blanked, or otherwise made unusable.

Figure 1A:
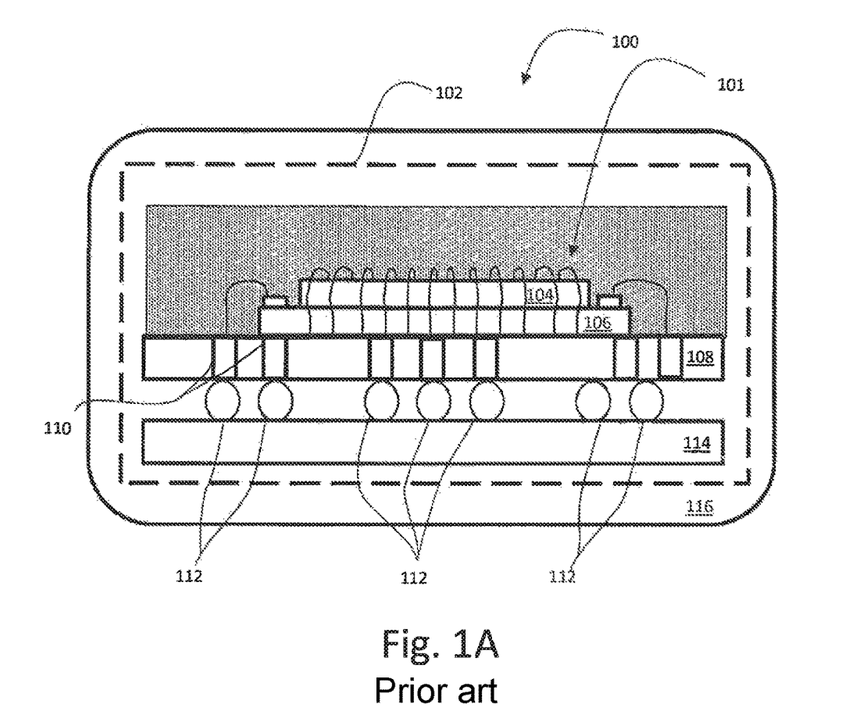
FIGS. 1A and 1B show prior art examples of tamper-proof packaging and in-chip anti-tamper protection respectively.

One known technique, as illustrated in FIG. 1A, is to wrap hardware in a tamper responsive mesh 102 (e.g. products from W.L. Gore and Associates) which consists of an electrical matrix that can detect an attempt at penetration due to a change in resistance. In the example of FIG. 1A, a security module 100 housing a Stacked Chip 'System on Chip' package 101 is shown, comprising a Dynamic memory (DRAM) chip 104 mounted on top of an application-specific integrated circuit (ASIC) 106. The stacked chips 104, 106, are in turn mounted on an intermediate substrate 108, which in this example includes Vertical Interconnect Accesses (vias) 110 (only two of which are labelled for reasons of clarity), allowing data and power to pass through the intermediate substrate 108. These elements are then mounted, via a number of solder ball bonds 112, on a Printed Circuit Board (PCB) 114. As will be appreciated by the skilled person, the PCB 114 will also comprise a connection, which passes through the tamper responsive mesh 102. For additional security, the whole package is also surrounded by encapsulating resin 116 to form the security module 100.

Figure 1B:
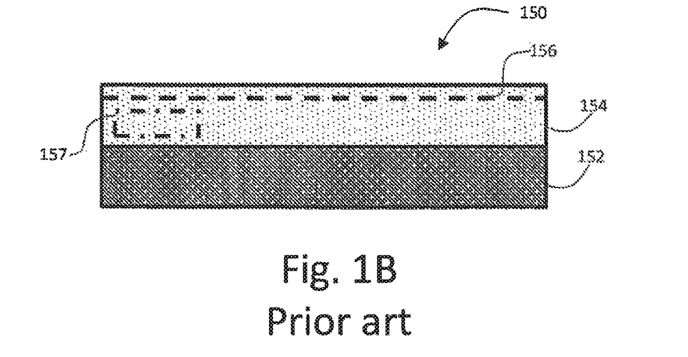

The skilled person will also be familiar with methods for providing such protection at chip level, as is illustrated schematically in FIG. 1B. As will be familiar to the skilled person, a chip or 'die' 150 is usually built up in layers on a substrate 152, which is often (but not always) made of silicon. Functional components are either added to or formed from the material of the substrate 152 in a lithographic process to form a portion of the die 150 termed herein a 'functional region' 154, and which is designed to allow the die 150 to perform its intended function. As will be familiar to the skilled person, the functionality of the die 150 is defined by forming layers (which are layers within the function region 154) of treated silicon, deposited material or the like. One known anti-tamper option is to include upper metal layer(s) in the die 150 to provide a tamper shield 156 (active and/or passive) to mitigate against such attacks. For example, a tamper shield 156 may comprise one or more metal track(s) arranged in coil (often a square or rectangular coil), or as a series of parallel tracks, or the like. However, such an approach has an important residual vulnerability—an attack can be made from the base of the die 150 through the substrate 152.

To address this, the skilled person may wrap a die (and/or the package containing the die) with a separate mesh such as the Gore mesh described above but this adds complexity and cost to the manufacturing process.

SUMMARY OF THE INVENTION

According to a first aspect of the invention, there is provided an electronic hardware assembly, the assembly comprising at least a first and second laminar component,
  wherein the first laminar component comprises a die, the die comprising a substrate, a functional region and a first protective layer,
  and the second laminar component comprises a second protective layer,
  wherein the first and second laminar components are arranged in a stack such that the functional region of the first laminar component is arranged within the assembly substantially between first and second protective layers.

It will be appreciated that the term 'functional region' is intended to refer to the region that allows the die to operate for intended purpose. Therefore, by way of example, if the die is arranged to provide a memory, the functional region provides data storage. If however the die is intended to provide a more complex Integrated Circuit (IC), it may comprise a plurality overlapping functional layers or units. Some functional layers/units may for example be diffused with dopants, while other may be implanted with ions, or formed of polysilicon or metal to provide conducting functional layers, or acting to define connections between functional layers or the like. As a further example, a capacitive structure will have functional layers which comprise parallel conducting plates and layers of insulating material between the plates. Other functional layer types and structures will be familiar to the skilled person.

The term 'stack' as used herein may refer to a close stack or the layers of the stack may be spaced apart from one another. So long as the laminar components lie in substantially parallel planes, and one component at least partially overlies another, this constitutes a 'stack' for the purpose of this invention. In the examples herein, it will be further noted that the stacks are fixed, i.e. in such stacks, the laminar components are fixed relative to one another in substantially parallel planes, and one component at least partially overlies another.

Further, the term 'protective layer' is intended to refer to any structure which resists or reacts to attempts to access the interior of the functional region of the die, including anti tamper layers, tamper resistant layers (which are difficult to physically penetrate), tamper evident layers, active tamper shield layers (which act to blank or destroy the content of the functional region of a die), and the like. As will be familiar to the skilled person, known active shields can act to ensure that sensitive data is electronically deleted or scrambled, and ideas for physically destroying structures have also been disclosed, for example in US2012/0068326, assigned to Endicott Interconnect Technologies. Such an arrangement is advantageous as the functional region may be largely surrounded by protective layers.

In one example of an electronic hardware assembly according to the invention, there is provided an assembly comprising two stacked dies, each of which comprises a substrate, a functional region and a protective layer, the functional regions (and preferably the substrates) being arranged within the assembly such that they are between the two protective layers.

The dies may thus be arranged 'back-to-back' or 'substrate to substrate', providing the function of each die, and each providing a protective layer to shield the base of the substrate of the other die from possible attack. There is a further advantage in some circumstances where the protective layer is a metallic layer, as this will provide heat conduction away from the functional regions. Although it will be noted that any top-layer formed of metal, for example an anti-tamper metal structure, would help to cool the compound die, the fact that the mesh is on two faces provides good heat transfer interface. However, as will be appreciated by the skilled person, the main power dissipation is active components on the silicon surface. The thermal resistivity between the silicon surface and top level metal may be higher due to inter-metal dielectrics so this may not be as efficient as removing heat via the substrate. Therefore, further heat conduction structures (such as will be familiar to the skilled person) may be provided.

The dies may have the same (i.e. a common) design, which could limit manufacturing costs. However, the dies may be configured differently. In some examples, one of the dies may only have minimal functionality enabled. In cases where multiple reconfigurable elements are included (e.g. microprocessors) then each die could have specific functions allocated to it. Such an assembly may be highly versatile.

In another example of an electronic hardware assembly according to the invention, there is provided an assembly comprising two stacked dies, each of which comprises a substrate and a protective layer, wherein one of the dies further comprises a functional region, and the other of the dies comprises a dummy region, and the functional region is arranged within the assembly such it is between the two protective layers. In some examples, the dummy region is arranged such that is outside the protective layers.

The dummy region may be a defective functional region; i.e. a functional region which fails to perform one or more of its intended function(s), but in which the protective layer is capable of providing protection. This is advantageous as it prevents defective dies from be wasted entirely, so long as they are capable of providing a protective function. However, the dummy region may also be, in principle, functional but not used in the electronic hardware assembly. In such examples, it may be preferable to arrange the dummy region between the protective layers.

As an alternative to providing a laminar component with a dummy region, the second laminar component may comprise a die which has been processed simply to provide a protective layer. This may be advantageous as such a die may be relatively inexpensive to produce, in particular if the feature size can be made relatively large when compared to those typically seen on an ASIC or other die.

Of course, there may be more than two dies, and in such examples, preferably all functional regions are between the two protective layers.

In a further example, the second laminar component may be a lid of a hardware package. The lid may for example be made of a ceramic material, a metal, or the like. In such examples, the protective layer may be provided by one or more metal tracks, for example screen printed onto the lid (in the case of a metal lid, there may be an insulating layer between the metal and the track(s)). The lid may comprise one or more Printed Circuit Boards (PCBs) printed with one or more tracks. As a further example, the shield could be simply printed onto the material of the lid. In such embodiments, there may be an electrical connection between the protective layer in or on the lid and the functional region of the die. This electrical connection could be provided using a 'through package vias'.

In some embodiments, the laminar components are inter-connected, for example comprising vias (such as Through Silicon Vias (TSVs)) to inter-connect them. The vias may, for example, be filled with a conductor, such as a tungsten connector. Use of vias, in particular TSVs, in electronic hardware assemblies is advantageous when compared to alternative possibilities such as 'package-on-package' hardware assemblies as they can be made with more dense connections and because the length of the connections is generally shorter. This can improve connectivity at the same time as providing small assemblies. It also allows multiple dies, possibly performing multiple functions, to be provided with a small footprint.

In such examples, the vias may also be inter-connected with one or both protective layers. In such examples, in particular where the protective layer is an anti-tamper layer (such as an anti-tamper grid or track or the like, which detects tamper events) the vias could therefore be functionally part of the anti-tamper protection and provide edge tamper detection.

In some examples, the protective layer comprises one or more metallic layers or tracks. This is a known form of a protective layer.

In some embodiments, the assembly comprises at least one monitor, arranged to monitor the status of the protective layers. In some examples, a single monitor is arranged to monitor the protective layer on at least two laminar components. This limits the functionality required on the other laminar component(s). Further, it may be preferable that the monitor is arranged between the protective layers, so that it benefits from the protection provided and does not itself present an avenue for attack.

In a preferred embodiment, the functional region of at least one die within the assembly comprises a monitoring unit, capable of monitoring the protective layer. The monitoring unit may, for example, be fabricated lithographically in the functional region along with any other functional components of the functional region. This is a known way of providing a monitor for a protective layer, and in particular for monitoring active tamper shields.

The monitoring unit may, for example be arranged to detect one of a change in resistance (shorting, open circuit, change in resistance, resistive bridge) and/or a change in capacitance or electro-magnetic field properties (e.g. based on MEMs principles), or the like. As will be appreciated by the skilled person, new techniques are being developed in this area, and any tamper detection technique could be used in conjunction with the inventions described herein.

According to a second aspect of the invention, there is provided an electronics hardware package which comprises an electronics hardware assembly according to the first aspect of the invention, wherein the second laminar component comprising a lid of the package.

The lid may comprise any suitable material. As will be familiar to the skilled person, known package lids comprise ceramic, glass, metal or the like. The protective layer may comprise one or more tracks, for example screen-printed, on the lid in the manner of a PCB. In some examples, more than one layer may be provided. This allows, for example, separated tracks on a first layer to be overlaid by offset tracks on a second layer. Thus the whole surface may be readily protected.

In a preferred example, the lid is electrically interconnected with the other laminar component. This allows for monitoring of both protective layers by a single monitor, which may be a monitoring unit within one of the laminar components, or may be a separate monitor (which is preferably housed within the package, so it is itself protected).

The lid may be interconnected with another laminar component using through-package vias, for example arranged through the side walls of the package. This is advantageous as it may extend the protection provided by the protective layer, for example providing edge protection for the package. However, it is also advantageous as it allows the lid to be connected to another power source, and/or to communicate with the die, without requiring the use of wire bonds or the like.

The package may have any of the features mentioned in the first aspect of the invention. Indeed, a stack as described in relation to the first aspect of the invention could be housed in a package, and, optionally, that package could have a lid comprises a protective layer.

The invention is also directed to methods by which the described apparatus operates and including method steps for assembling and for carrying out every function of the apparatus.

The preferred features may be combined as appropriate, as would be apparent to a skilled person, and may be combined with any of the aspects of the invention.

BRIEF DESCRIPTION OF THE DRAWINGS

In order to show how the invention may be carried into effect, embodiments of the invention are now described below by way of example only and with reference to the accompanying figures in which.

DETAILED DESCRIPTION OF INVENTION

As described above, FIG. 1A shows known system of protecting a package, in particular showing a package 100 comprising a Stacked Chip 'System on Chip' (SCS) electronics hardware assembly 101 enclosed in a tamper responsive mesh 102. The assembly 101 comprises a DRAM chip 104 mounted on an ASIC 106. The stacked chips 104, 106, are in turn mounted on a ceramic substrate 108, which includes vertical interconnect accesses (vias) 110. These elements are then mounted, via a number of solder ball bonds 112, on a base substrate 114 (in this example a PCB), and the SCS 101 is also surrounded by encapsulating resin 116. As will be familiar to the skilled person, the substrate 108 could be replaced with a PCB in other known designs FIG. 1B shows a known method for providing protection of a single chip or 'die' 150. The die 150 is built up in layers on a substrate 152, in this example a silicon substrate. Functional components are either added to or formed from the material of the substrate 152 in a lithographic process to form a functional region 154, which usually comprises a number of functional layers, which may overlap. A tamper shield 156 in the form of a metal patterned layer is arranged on the functional region 154, and is topped with a silicon oxy-nitride passivation layer which is used to protect the die 150. The functional region 154 also contains therein a monitoring unit 157, which is arranged to monitor the tamper shield 156.

The tamper shield 156 in this die 150, and the dies comprising a functional regions described hereinafter, is distal to the substrate 152, arranged such that substantially all the functional components, or at least any functional components which might perform sensitive processes, are between the protective layer 156 and the substrate 154. The tamper shield 156 provides a protective layer.

Figure 2:
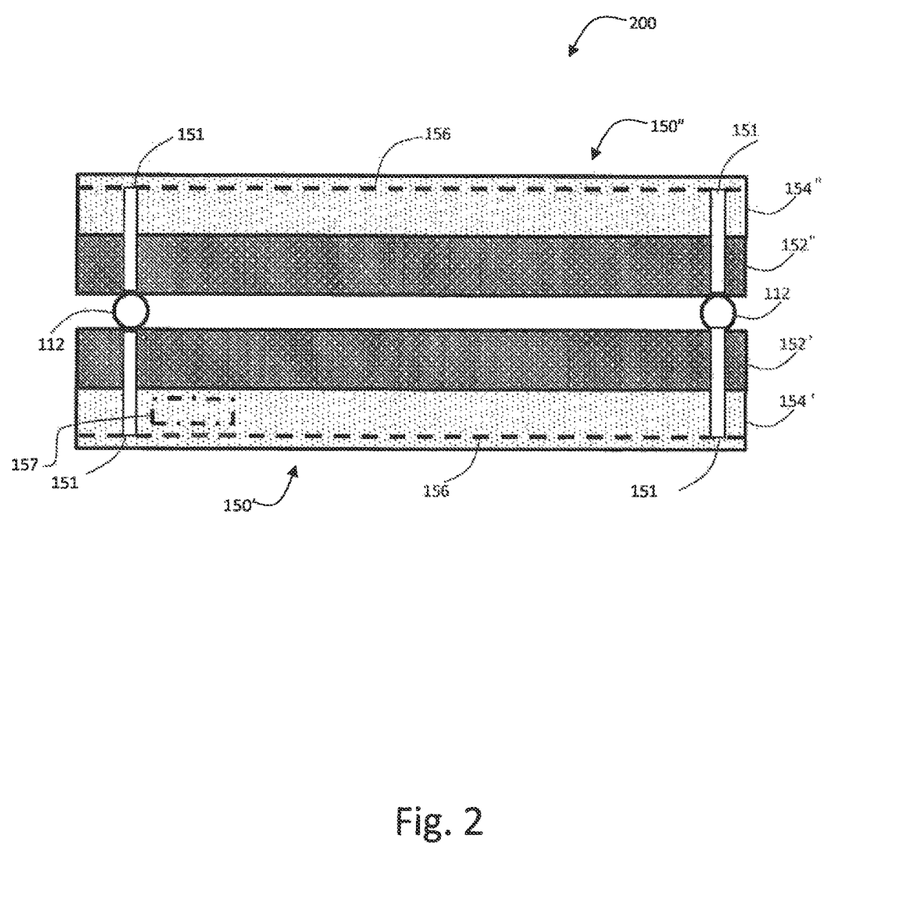
FIG. 2 shows an electronic hardware assembly according to one embodiment of the present invention.

FIG. 2 shows an electronics hardware assembly 200 according to one embodiment of the present invention. Parts in common with those in FIGS. 1A and 1B are labeled with like reference numbers. The assembly comprises two laminar components in the form of dies 150', 150" as shown in FIG. 1B which are arranged 'back-to-back', i.e. such that the substrates 152', 152" are facing each other and the protective layers provided by the tamper shields 156 are arranged outermost in the stack. In this example, the function regions 154', 154" are both Application Specific integrated Circuits (ASICs), formed lithographically with a number of functional layers, the tamper shield 156 having been added, again lithographically, as one of the outer layers of the die 150', 150". One of the dies 150' also comprises a monitoring unit 157 in the functional region 154', but this is not present in the other of the dies 150". Instead, its tamper shield 156 is monitored by the monitoring unit 157 in the other die 150' as described below.

In this example, the dies 150', 150" further comprise vias 151, which in this example are Through Silicon Vias (TSVs) in an edge region thereof, which are filled with a conductor, in this case tungsten. Although not visible in the cross sectional view shown in the Figures, the vias 151 are preferably arranged at closely spaced intervals along at least the perimeter of the assembly 200. The dies 150', 150" are joined through use of solder ball bonds 112, which also connect the vias 151. The vias 151 provide a connection between the two protective layers 156, and allow both protective layers 156 to be monitored by a single monitoring unit 157. However, this need not be the case and the two protective layers 156 could be monitored separately (i.e. isolated from one another but both providing an input to the same monitoring unit 157, or else more than one monitoring unit could be provided)

Although the vias 151 mentioned above are arranged in an edge regions, they could be arranged across the whole die surface, for example in a regular pattern. This could be to sample the protective layer across its whole surface. In addition, while the use of solder ball bonds 112 may be sufficient to join the dies 150', 150", it may be desirable to flow glue between the two dies 150', 150" for mechanical robustness, as will be familiar to the skilled person. This has the additional benefit that it will also make it harder for an attacker to gain access to the ball bonds 112.

Figure 3:
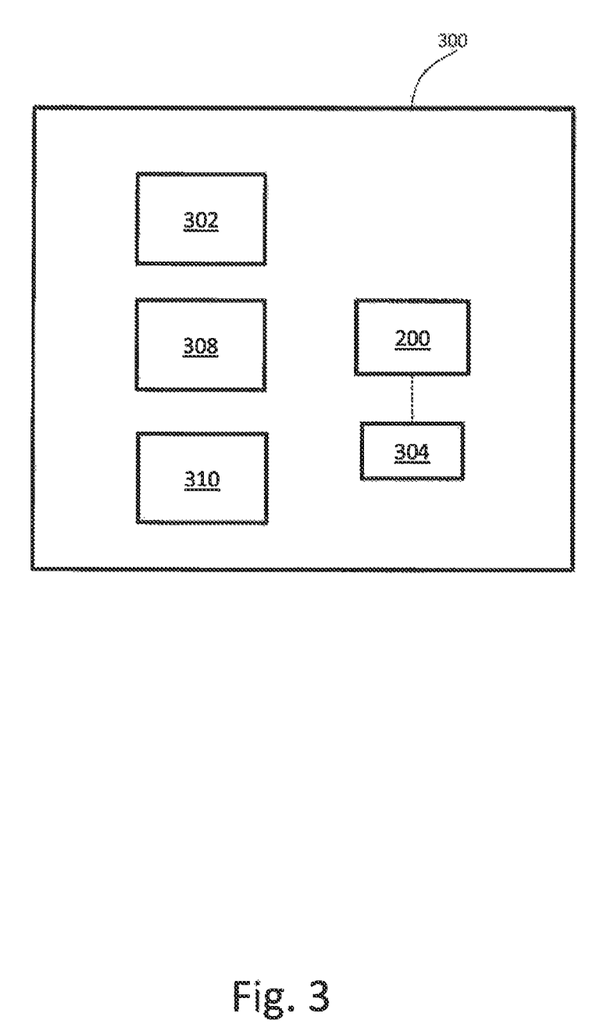
FIG. 3 schematically shows a computing device incorporating the assembly of FIG. 2.

A schematic representation of the assembly 200 of FIG. 2 arranged in a device, in this example, a computing device 300, is shown in FIG. 3. The computing device 300 further comprises a main power source 302, a back-up power source 304, arranged to provide power to the tamper shields 156 even when the main power source 302 is switched off, a memory 308, capable of receiving data from, and sending data to the assembly 200 (which, in this example, is arranged to act as the central processing unit of the computing device 300) and an input/output device 310, arranged to allow communication with the assembly 200.

In use of the computing device 300, if an attempt is made to access the interior of the assembly 200, this will result in a change in the resistivity of the pattern providing the tamper shield 156, which will be detected by the monitoring unit 157. Note that, because the vias 151 are arranged about the perimeter of the assembly 200 and are connected to the tamper shields 156, an attempt to gain access through the side of the assembly 200 will, in all likelihood, break at least one of the connections provided by the vias 151, thus resulting in a change of resistivity, which will be detected by the monitoring unit 157.

Figure 4:
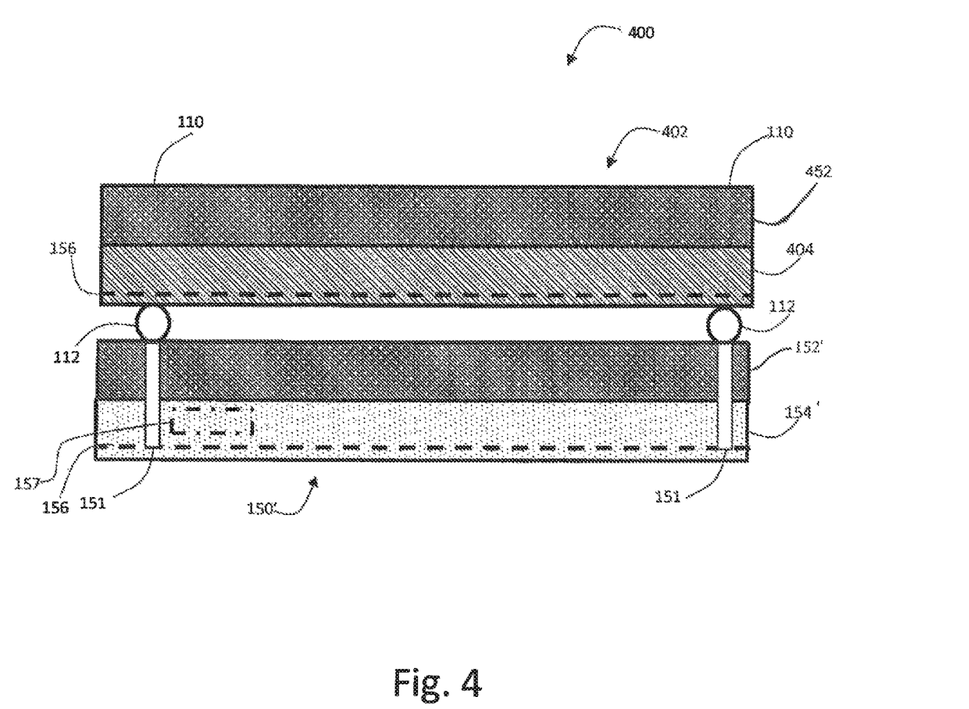
FIG. 4 shows an electronic hardware assembly according to a second embodiment of the present invention.

An electronics hardware assembly 400 according to an alternative embodiment of the present invention is shown in FIG. 4 and parts in common with those in FIGS. 1A and 1B are labelled with like reference numbers. The assembly 400 comprises laminar components in the form of two dies, one of which is a functional die 150' such as shown in FIG. 1B, and the other die is a defective die 402. The defective die 402 comprises, in the functional region, a dummy layer 404 and a tamper shield 156. In this example, the defective die 402 comprises a die which has been lithographically processed, including the incorporation of the tamper shield 156, but has failed to meet tests with respect to its functionality. However so long as the tamper shield 156 is capable of operation, the die 402 need not be disposed of, and use can be made of at least the tamper shield 156. This is attractive given the 'yield' of viable dies following lithographic processes can be relatively low (for example, 30%), so this provides a use for otherwise useless dies.

It will be noted that the defective die 402 does not comprise vias (the tamper shield 156 thereof being exposed to the surface of the die, allowing the protective layers 156 and the monitoring unit 157 to be interconnected via the solder ball bonds 112), and is therefore simpler to make compared to the 'back-to-back' embodiment of FIG. 2.

In this example, the dies 150', 402 are both arranged with their substrates 152', 452 uppermost. As the stack of two dies has only one true functional region 154' and the protective layers provided by the tamper shields 156 are arranged either side of the function layer 154', it is protected on both major faces. In this example, the function of the functional region 154' is to provide Random Access Memory (RAM), and it is formed lithographically, the tamper shield 156 and the monitoring unit 157 having been added, again lithographically. Again, the assembly 400 comprises vias 151 through the die 150', in an edge region thereof, which are filled with a conductor and are arranged at closely spaced intervals along the perimeter of the stack. The dies 150', 402 are again joined through use of solder ball bonds 112, possibly with the addition of glue.

Although the dies 150', 402 are arranged with their substrates 152', 452 uppermost, it may be desirable to stack the dies 150', 402 as shown in FIG. 2. While this would require more complicated connections between the protective layers (for example, vias could be used), it may be desirable if the structure of even a defective die is to be protected. This may be the case, for example, if the defective die 402 has the same topology as the functional die 150', in which case, an attacker could gain useful knowledge from review of the defective die 402. The dummy region 404 could also, in principle, comprise a functional, but not utilized, functional region, in which case protection thereof could be beneficial for the same reason.

However, in other examples, the dummy region 404 may only have been lithographically processed simply to add a tamper shield 156, in all other senses effectively comprising a continuation of the substrate. In other words, the defective die 402 could be replaced with a die with only 1 or 2 metal layers forming the protective layer 156 or shield. There would be no active components on such a die and it could be manufactured with a larger minimum feature size process than a functional die, and therefore manufactured at a lower cost.

The assembly 400 could be used in a similar manner to that described in relation to FIG. 3 above.

Figure 5:
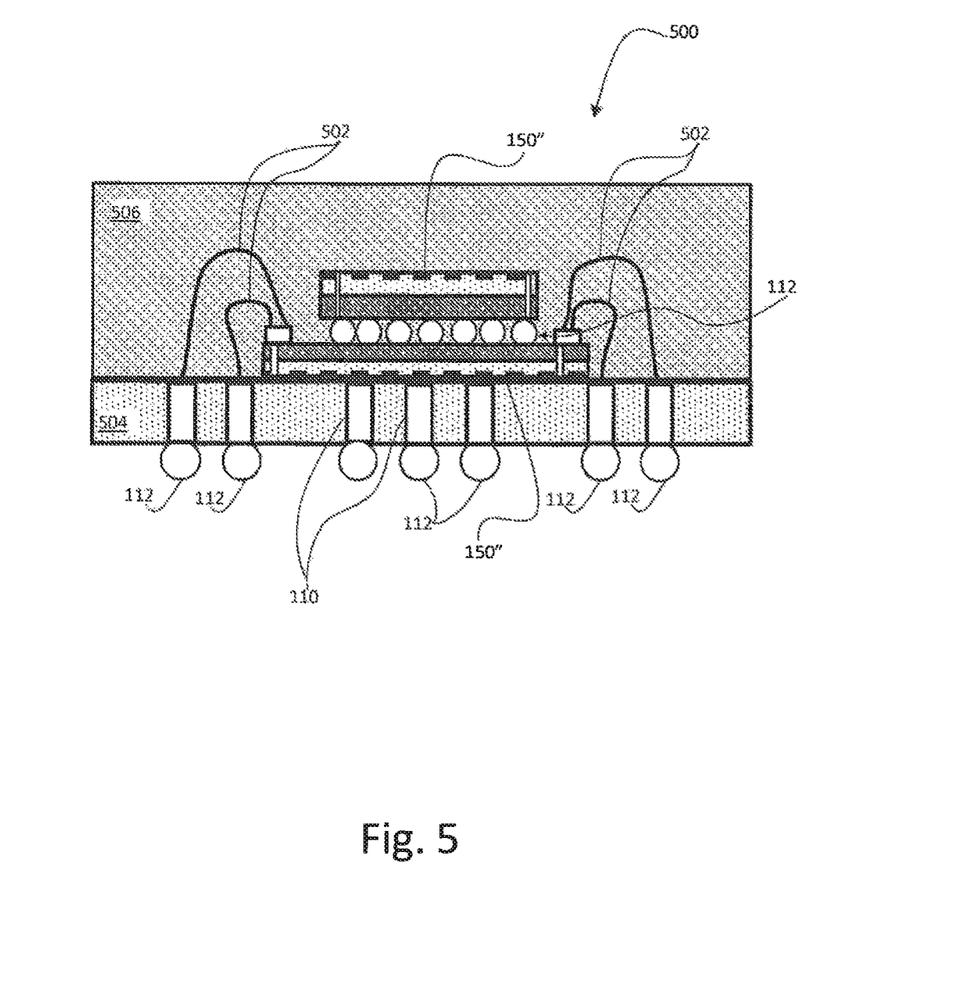
FIGS. 5 and 6 shows packages, each comprising an assembly as shown FIG. 2.
Figure 6:
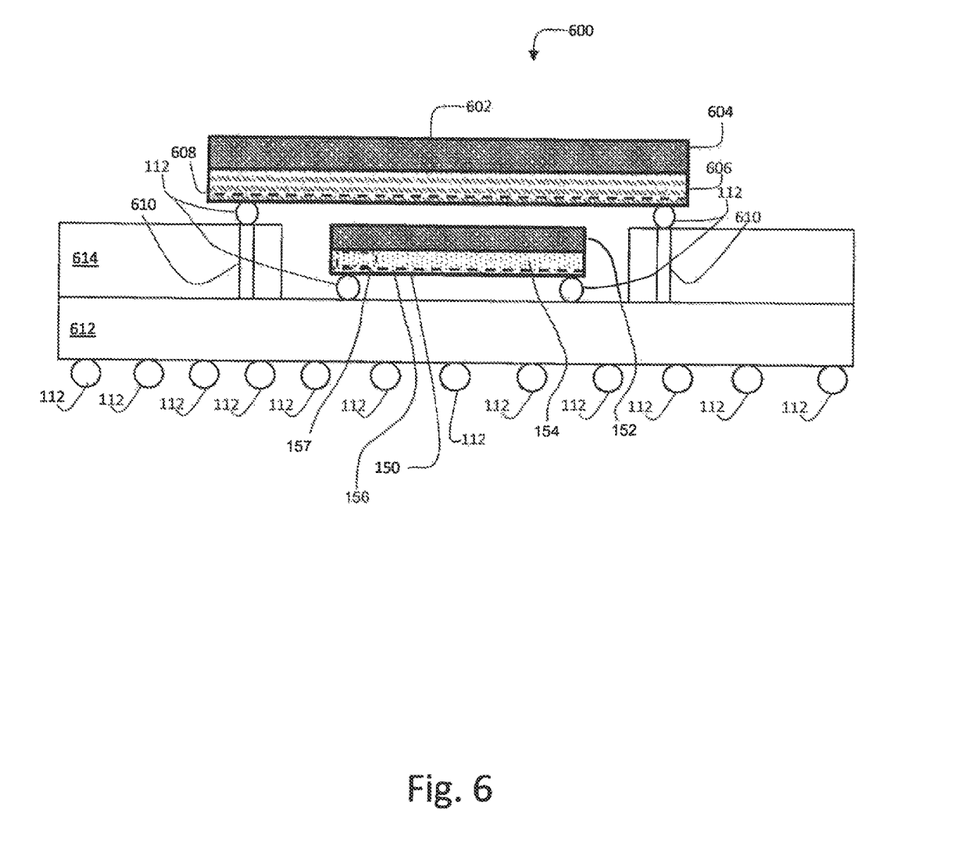

FIGS. 5 and 6 give further examples of assemblies 500, 600 according to embodiments of the invention.

In FIG. 5, a stack of two laminar components arranged in the form of 'back to back' (or 'substrate to substrate') dies 150" similar to that shown in FIG. 2 is illustrated. The dies 150" in this example are different sizes, and the assembly also comprises wire bonds 502. The two dies 150" are also mounted on a separate substrate 504, which comprises vias 110 and therefore facilitates 'package on package' designs. It would also be possible to replace the ball bonds 112 between the dies 150" with wire bonds, such the substrates of the dies were substantially in contact. The whole assembly in this example is encapsulated in a plastic material 506.

It will be noted that the use of wire bonds 502 can remove the need for vias in the dies 150" themselves.

Although not shown in FIG. 5, if the protective layers are active layers, at least one die may also comprise a monitoring unit 157, or else a separate monitor could be provided in between the dies 150".

In FIG. 6, package-level protection is illustrated. A die 150 similar to that shown in FIG. 1B is mounted within a package 600 comprising a lid 602. As described in relation to FIG. 1B, the die 150 has a functional region 154 on which is arranged a tamper shield 156 providing a protective layer, and in which is provided a monitoring unit 157 and is arranged such that the substrate 152 faces the lid 602. The lid 602 is a laminar component comprising a substrate 604 on which is mounted a multilayer PCB 606, wherein at least one of the layers is an anti-tamper layer 608 (for example as described in U.S. Pat. No. 6,853,093B2, which is incorporated herein by reference to the fullest extent possible). In preferred examples, more than one layer is an anti-tamper layer 608. For example, a first anti-tamper layer may comprise a number of screen printed lines with spaces there between, and second similar layer may be provided with an offset pattern, so that the lines thereon lies between the lines on the other layer when stacked thereon.

In this example, the die 150 is arranged within a package 600, which comprises a number of through-package vias 610 connecting the package base 612 to the lid 602 through the sidewalls 614. The anti-tamper PCB layer 608 of the lid 602 provides a shield for the interior of the package 600, and the shielding is extended to cover the sides of the package 600 through use of vias 110, 610 as described above. The die 150 in this example is connected to the vias by a track printed on the top side of the base 612 (not shown), although there are alternatives such as providing wire bonds.

Various combinations or alternatives to the above described embodiments will occur to the skilled person and are within the scope of the invention. For example either die 150' in the assembly shown in FIG. 5 could be replaced by a die as shown in FIG. 4, i.e. a die 400 comprising a dummy region, in which case, the dies 150 need not be arranged 'back to back'. In addition, the lid 602 in FIG. 6 could be the other way up, and provided with vias. However, it will be noted that, arranged as shown, the protective shield is itself protected by the material of the lid, and therefore unlikely to suffer casual damage. In particular, in the example of FIG. 6 it can readily be appreciated that a monitor for the protective layers could be provided within the package 600, but outside the die 150 itself.

Wire bonds could replace some or all vias, and vice versa. There may be more than two laminar components in a stack providing an assembly or a package.

Any range or device value given herein may be extended or altered without losing the effect sought, as will be apparent to the skilled person for an understanding of the teachings herein.

The invention claimed is:

1. An electronic hardware assembly comprising:
    at least a first laminar component and second laminar component, wherein
    the first laminar component comprises a first die, the first die comprising a first substrate, a first functional region and a first protective layer,
    the second laminar component comprises a second protective layer,
    the first laminar component and second laminar component are arranged in a stack such that the first functional region of the first laminar component is arranged within the assembly substantially between the first protective layer and the second protective layer, and
    the second laminar component comprises a second die which has been processed to just provide the second protective layer.

2. An electronic hardware assembly according to claim 1, wherein at least one of the first protective layer and the second protective layer comprises a structure which resists or reacts to attempts to access the first functional region of the first die.

3. An electronic hardware assembly according to claim 1, wherein the first die is arranged, in use, to have specific functions allocated thereto.

4. An electronic hardware assembly according to claim 1, wherein the second laminar component comprises the second die, and the second die comprises a second substrate and the second protective layer.

5. An electronic hardware assembly according to claim 1, wherein the laminar components are electrically interconnected.

6. An electronic hardware assembly according to claim 5, wherein the laminar components are electrically interconnected through Vertical Interconnect Accesses (vias).

7. An electronic hardware assembly according to claim 6, wherein the vias are inter-connected with the first and second protective layer.

8. An electronic hardware assembly according to claim 1, further comprising:
    at least one monitoring unit arranged between the protective layers and provided to monitor the protective layers.

9. An electronic hardware assembly according to claim 8, wherein a single monitoring unit is provided to monitor the protective layers of the first laminar component and the second laminar component.

10. An electronic hardware assembly according to claim 8, wherein the monitoring unit is provided within the first functional region of the first laminar component.

* * * * *